United States Patent [19]

Nonaka

[11] Patent Number: 5,391,939
[45] Date of Patent: Feb. 21, 1995

[54] OUTPUT CIRCUIT OF A SEMICONDUCTOR INTEGRATED CIRCUIT

[75] Inventor: Satoshi Nonaka, Yokohama, Japan

[73] Assignee: Kabushiki Kaisha Toshiba, Kawasaki, Japan

[21] Appl. No.: 937,067

[22] Filed: Aug. 28, 1992

[30] Foreign Application Priority Data

Aug. 30, 1991 [JP] Japan .................. 3-220738

[51] Int. Cl.⁶ .............................................. H03K 17/16
[52] U.S. Cl. ...................................... 326/83; 326/121; 326/26
[58] Field of Search ............. 307/451, 443, 475, 482.1

[56] References Cited

U.S. PATENT DOCUMENTS

| | | | |
|---|---|---|---|
| 4,621,208 | 11/1986 | Van Tran | 307/473 |
| 4,797,579 | 1/1989 | Lewis | 307/451 |
| 4,961,010 | 10/1990 | Davis | 307/451 |
| 4,988,888 | 1/1991 | Hirose et al. | 307/451 |
| 5,043,604 | 8/1991 | Komaki | 307/451 |
| 5,089,722 | 2/1992 | Amedeo | 307/451 |
| 5,140,194 | 8/1992 | Okitaka | 307/451 |

*Primary Examiner*—Edward P. Westin
*Assistant Examiner*—Andrew Sanders
*Attorney, Agent, or Firm*—Banner, Birch, McKie & Beckett

[57] ABSTRACT

A output circuit of a semiconductor integrated circuit comprises a prebuffer circuit, an output buffer circuit comprising first and second output buffer circuits for receiving the output of said prebuffer circuit, said first output buffer circuit comprising a CMOS inverter having its input terminal connected to the output terminal of said output buffer circuit and its output terminal connected to an output terminal, said second output buffer circuit comprising MOS transistors for electrically charging or discharging said output terminal and capacitances, the output of said prebuffer circuit being supplied to the gates of the MOS transistors through the respective capacitances. Such an output circuit can effectively reduce simultaneous switching noise without deteriorating its load driving capability.

19 Claims, 17 Drawing Sheets

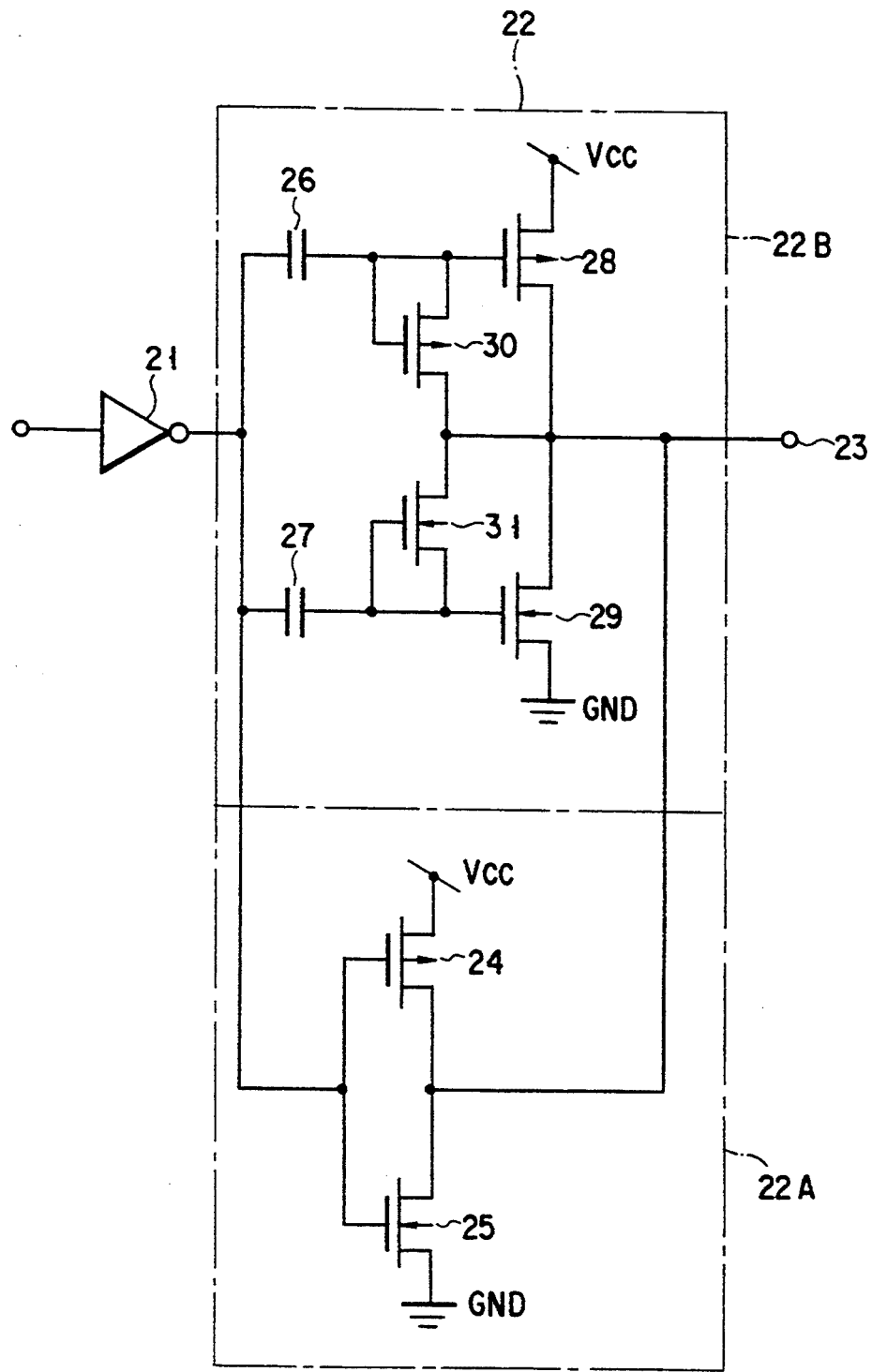
F I G. 3

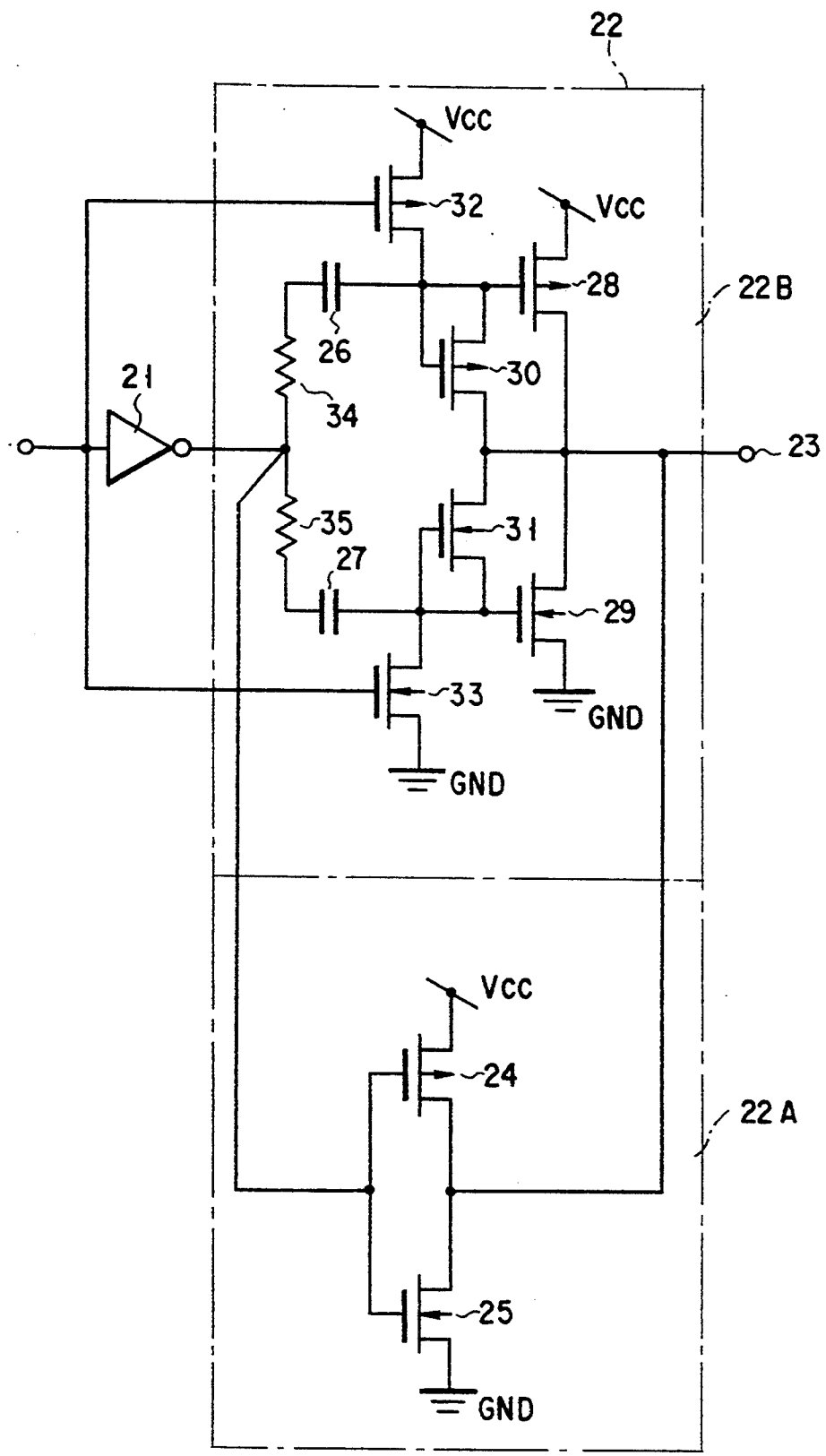
F I G. 6

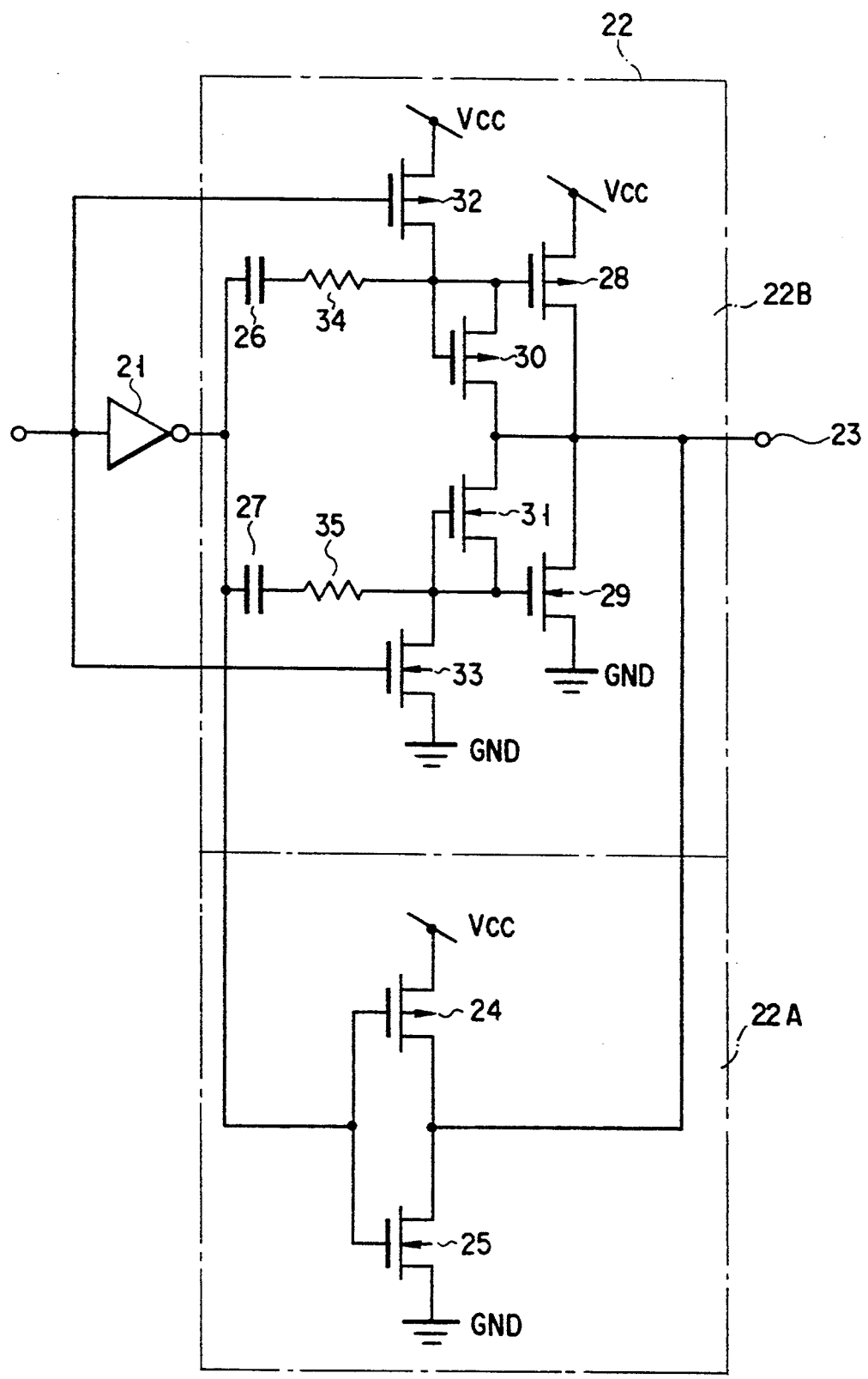
F I G. 7

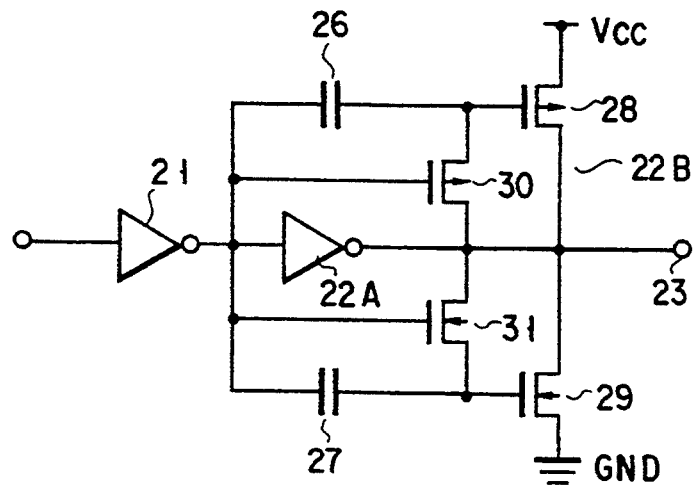
F I G. 9
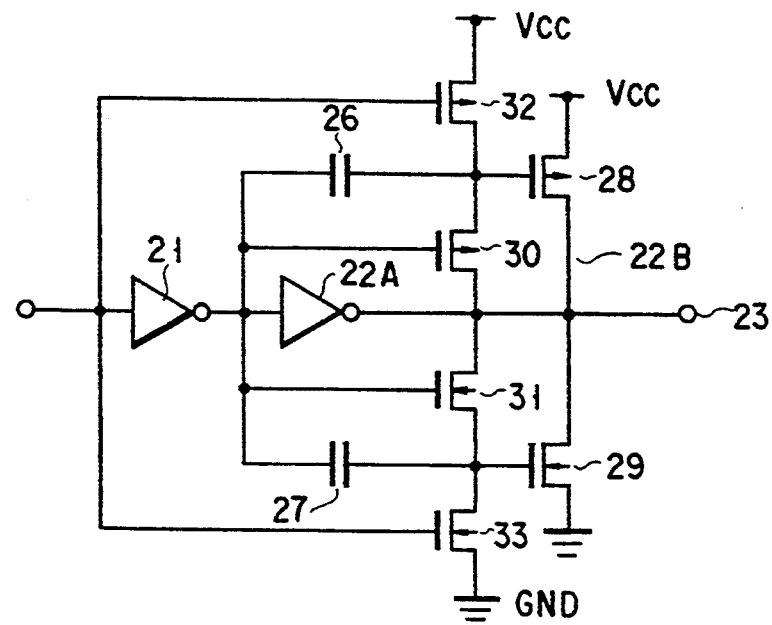
F I G. 10

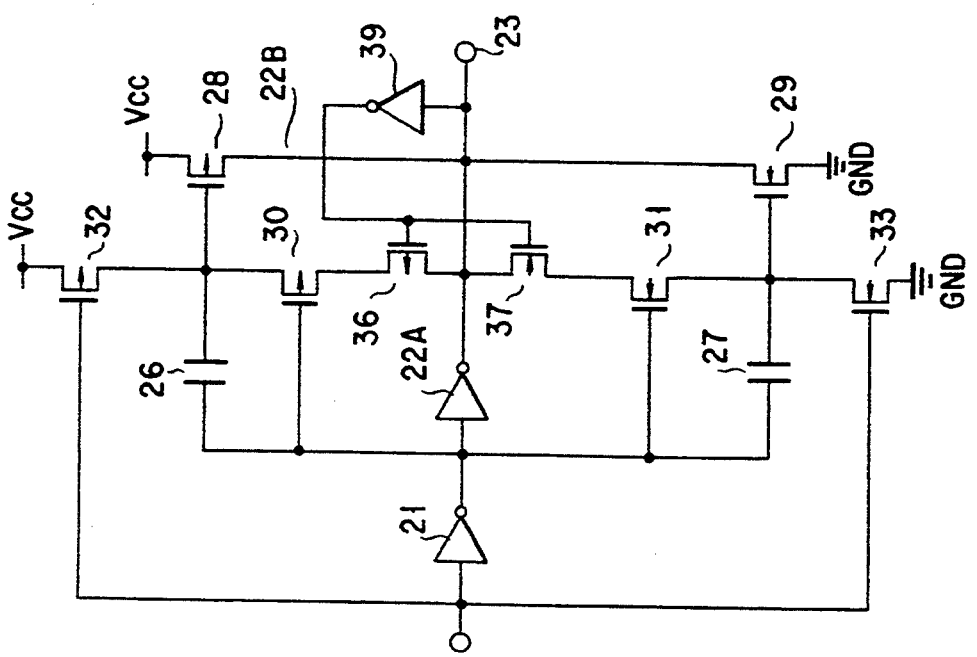
F I G. 16
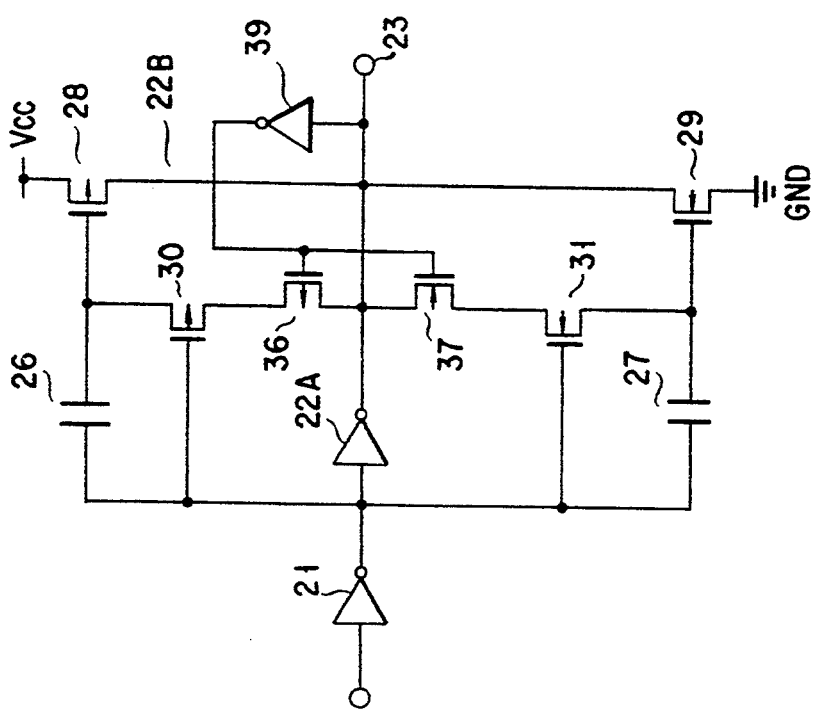
F I G. 15

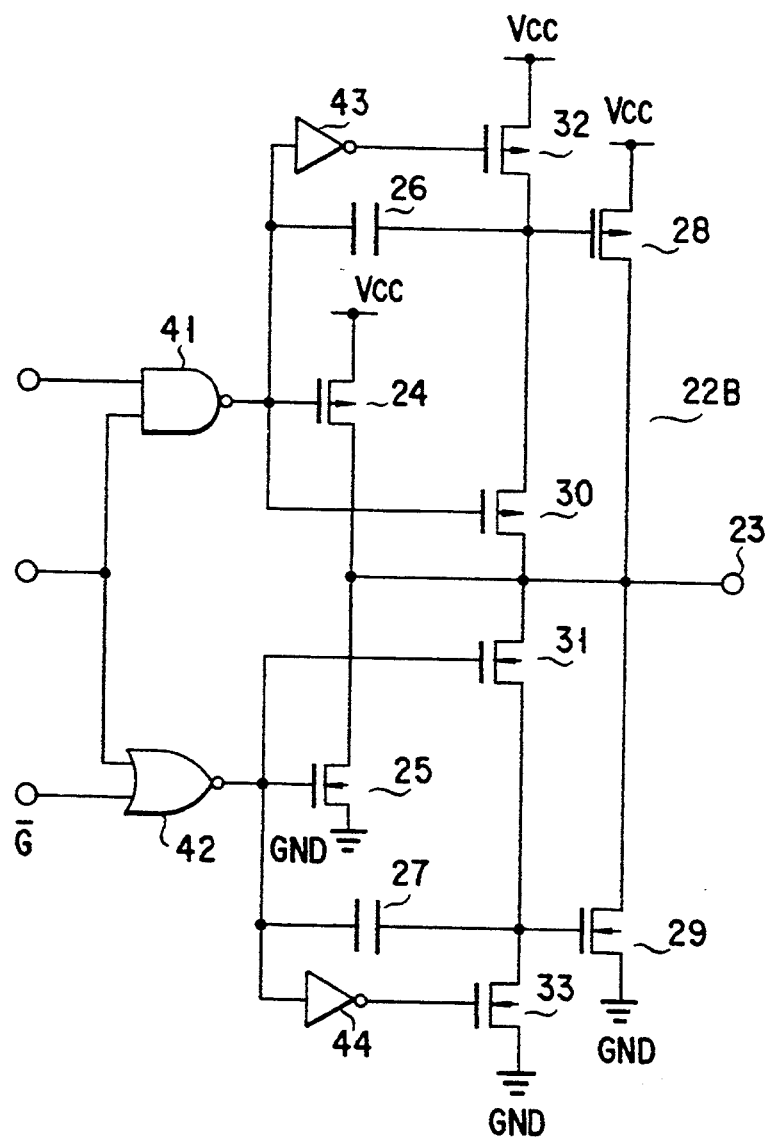
F I G. 19

OUTPUT CIRCUIT OF A SEMICONDUCTOR INTEGRATED CIRCUIT

BACKGROUND OF THE INVENTION

1. Field of the Invention

The present invention relates to an output circuit to be used for a semiconductor integrated circuit and, more particularly, it relates to an output circuit of a CMOS type semiconductor integrated circuit designed to reduce the influence of noises that can appear on related power source lines when a plurality of such output circuits of the integrated circuit are simultaneously switched on or off for output signals.

2. Description of the Related Art

FIG. 1 is a circuit diagram showing a conventional output circuit of a semiconductor integrated circuit. The semiconductor integrated circuit has the output circuit for outputting signals to the external devices. The signal in the integrated circuit (not shown) is sent out from output terminal 13 by way of a prebuffer circuit 11 and an output buffer circuit 12. CMOS inverters are normally used for the prebuffer circuit 11 and the output buffer circuit 12 in a CMOS type semiconductor integrated circuit. The output buffer circuit 12 of an output circuit 18 of this type normally comprises a P-channel MOS transistor 14 and an N-channel MOS transistor 15 having small dimensions (including the channel width) and hence a rather small current driving capability so that a large current may not flow, if instantaneously, between related power source lines.

As illustrated in FIG. 2, a large number of output circuits 18 are normally disposed in parallel between a high potential power source line 16 and a low potential power source line 17 in a semiconductor integrated circuit. Resistive, capacitive and inductive loads are parasitically existent on both power source lines 16 and 17. Therefore, when more than one of the output circuits 18 are simultaneously turned on or off for output signals, the level of the electric current flowing into the power source can enormously fluctuate within a short period of time to generate noise on either power source line 16 or 17, which may propagate and eventually appear on the output terminals of output circuits which are not turned on or off. Such noise is often called "simultaneous switching noise". In order to reduce the possibility of appearance of such noise, the MOS transistors 14, 15 of an output buffer circuit 12 of the type under consideration are made rather small. If, on the other hand, these devices are made too small, they can by turn reduce the switching speed of output signals. This tendency of reducing the switching speed can become remarkable when output circuits have a heavy load. An output circuit comprising small transistors and hence having a reduced switching speed cannot meet the requirement of high speed operation in the field of advanced electronic devices, meaning that any conventional output circuit cannot effectively eliminate the influence of simultaneous switching noise without undesirably reducing the load driving capability of the output circuit.

SUMMARY OF THE INVENTION

It is therefore an object of the present invention to provide an output circuit to be used for a semiconductor integrated circuit, that can eliminate or significantly reduce the influence of simultaneous switching noise without reducing the load driving capability of the output circuit.

According to an aspect of the present invention, there is provided an output circuit of a semiconductor integrated circuit, comprising: a signal output terminal; a prebuffer circuit for receiving an internal signal of the semiconductor integrated circuit; a first output buffer circuit connected between the prebuffer circuit and the signal output terminal, and controlled by the output signal of the prebuffer circuit for activation/deactivation; and a second output buffer circuit connected in parallel with the first output buffer circuit and between the first output buffer circuit and the signal output terminal, and controlled for activation by the output signal of the prebuffer circuit through a capacitance and for deactivation by a transistor circuit connected to the signal output circuit.

According to another aspect of the present invention, there is provided an output circuit of a semiconductor integrated circuit, comprising: a signal output terminal; a prebuffer circuit for receiving an internal signal of the semiconductor integrated circuit; a first output buffer circuit having its input terminal connected to the output terminal of the prebuffer circuit and its output terminal connected to the signal output terminal; and a second output buffer circuit comprising at least a pair of capacitances, each having one of its terminals connected to the output terminal of the prebuffer circuit, a first pair of transistors, each having one of the terminals of its current path connected to the signal output terminal and its control electrode connected to the other terminal of the capacitance and a second pair of transistors of a conductive type same as that of the first pair of transistors, each having its current path inserted between the control electrode of the corresponding first transistor and the signal output terminal and its control electrode connected to the other terminal of the corresponding capacitance.

According to still another aspect of the present invention, there is provided an output circuit of a semiconductor integrated circuit, comprising: a signal output terminal; a prebuffer circuit for receiving an internal signal of the semiconductor integrated circuit and a control signal for controlling the signal output terminal in a high impedance state and transmitting first and second signals in accordance with the received two signals; a first output buffer circuit comprising a P-channel MOS transistor and an N-channel MOS transistor for respectively receiving the first and second signals through their respective gates and having its output terminal connected to the signal output terminal; and a second output buffer circuit comprising first and second capacitances each having one of its terminals connected to the output terminal of the prebuffer circuit, a P-channel first MOS transistor having one of the terminals of its current path between its source and drain connected to a first power source and its gate connected to the other terminal of the first capacitance, an N-channel second MOS transistor having one of the terminals of its current path between its source and drain connected to a second power source and its gate connected to the other terminal of the second capacitance, a P-channel third MOS transistor having its current path between its source and drain inserted between the gate of the first MOS transistor and the output terminal and its gate connected to the other terminal of the first capacitance and an N-channel fourth MOS transistor having its current path between its source and drain inserted between the gate of the second MOS transistor and the output terminal and its gate connected to the other terminal of the second capacitance.

With such arrangements, when the level of the output signal of the prebuffer circuit is changed, the output terminal is driven by the first output buffer circuit. While, in the second output buffer circuit, the output signal of the prebuffer circuit is supplied to the control electrode of the first transistor for driving the output terminal through the capacitance. Thus, any fluctuation of the potential at the control electrode of said first transistor is reduced and the variation per unit time in the electric current running through the output terminal when the output terminal is driven by the second output buffer circuit is made small if compared with a case where the output terminal is driven by a single output buffer circuit having a same capability. Besides, the control gate to the first transistor comes to show a potential similar to that of the output terminal when the second transistor is made active after the potential of the signal of the output terminal is changed to a certain extent so that the first transistor is deactivated. In other words, after the signal potential of the output terminal is changed to a certain extent, the terminal is driven only by the first output buffer circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram of a first embodiment of the present invention;

FIG. 6 is a circuit diagram of a third embodiment of the present invention;

FIG. 7 is a circuit diagram of a fourth embodiment of the present invention;

FIG. 9 is a circuit diagram of a sixth embodiment of the present invention;

FIG. 10 is a circuit diagram of a seventh embodiment of the present invention;

FIG. 15 is a circuit diagram of a twelfth embodiment of the present invention;

FIG. 16 is a circuit diagram of a thirteenth embodiment of the present invention;

FIG. 19 is a circuit diagram of a sixteenth embodiment of the present invention;

DETAILED DESCRIPTION OF THE PREFERRED EMBODIMENTS

The present invention will be described in greater detail by referring to the accompanying drawings that illustrate preferred embodiments of the present invention.

Figure 2:
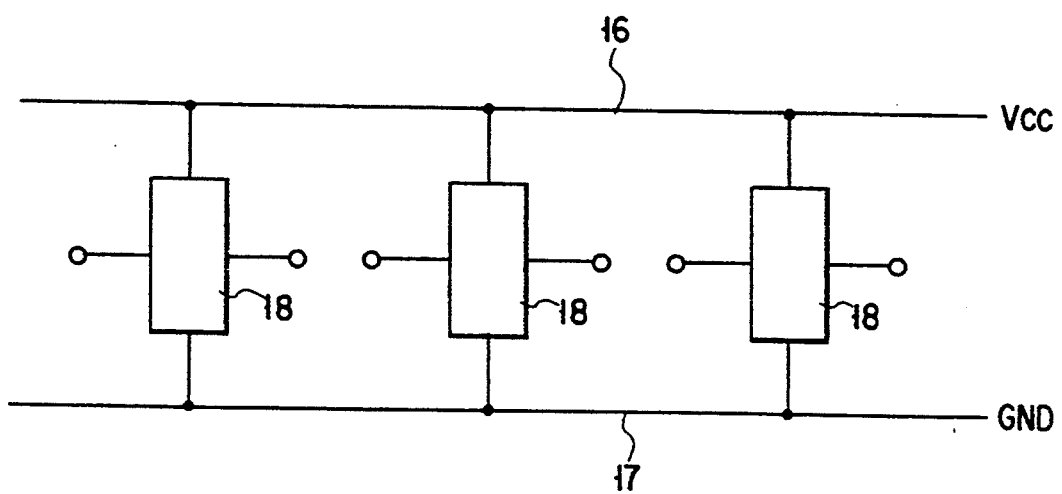
FIG. 2 is a circuit diagram of a semiconductor integrated circuit comprising a plurality of conventional output circuits.

FIG. 3 shows a circuit diagram of a first preferred embodiment of the output circuit to be used for a semiconductor integrated circuit according to the present invention. Referring to FIG. 3, the signal in a semiconductor integrated circuit is amplified and waveform-shaped by prebuffer circuit 21, and fed to an output buffer circuit 22. Signals from the prebuffer circuit 21 are amplified and waveform-shaped by the output buffer circuit 22 before they are sent out of the integrated circuit through an output terminal 23. The embodiment represents a plurality of identical output circuits disposed between a pair of power source lines as illustrated in FIG. 2. The output buffer circuit 22 comprises a first output buffer circuit 22A and a second output buffer circuit 22B. The first output buffer circuit 22A is in fact a CMOS inverter comprising a P-channel MOS transistor 24 whose source, drain and gate are connected to high potential power source Vcc, the output terminal 23 and the output terminal of the prebuffer circuit 21, respectively, and an N-channel MOS transistor 25 whose source, drain and gate are connected to low voltage power source GND, the output terminal 23 and the output terminal of the prebuffer circuit 21, respectively.

The second output buffer circuit 22B comprises first and second capacitances 26, 27, each having one of the two terminals connected to the output terminal of the prebuffer circuit 21; a P-channel MOS transistor 28 whose source, drain and gate are respectively connected to the high potential power source Vcc, the output terminal 23 and the other terminal of said first capacitance 26; an N-channel MOS transistor 29 whose source, drain and gate are respectively connected to the low voltage power source GND, the output terminal 23 and the other terminal of the second capacitance 27; a P-channel MOS transistor 30 whose current path between its source and drain is inserted between the gate of the MOS transistor 28 and the output terminal 23 and whose gate is connected to the other terminal of the first capacitance 26; and an N-channel MOS transistor 31 whose current path between its source and drain is inserted between the gate of the MOS transistor 29 and the output terminal 23 and whose gate is connected to the other terminal of the second capacitance 27.

Some of the dimensions of the P- and N-channel MOS transistors 24 and 25, including the channel width, of the first output buffer circuit 22A are smaller than the corresponding respective dimensions of the P- and N-channel MOS transistors 28 and 29 that directly drive the output terminal 23 in the second output buffer circuit 22B. The current driving capability of the prebuffer circuit 21 and the first and second capacitances 26, 27 are so selected that the variation per unit time in the potential of the gate of the MOS transistor 28 and that of the gate of the MOS transistor 29 of the second output buffer circuit 22B are smaller than that of any output signal of the prebuffer circuit 21.

The first and second capacitances 26, 27 of the above embodiment may be physical capacitive devices such as MOS capacitors, gate capacitances of MOS transistors or PN-junction capacitances. Alternatively, they may be parasitic capacitances such as gate capacitances that are parasitically existent on the gates of the MOS transistors 28, 30 or those of the MOS transistors 29, 31.

Figure 4:
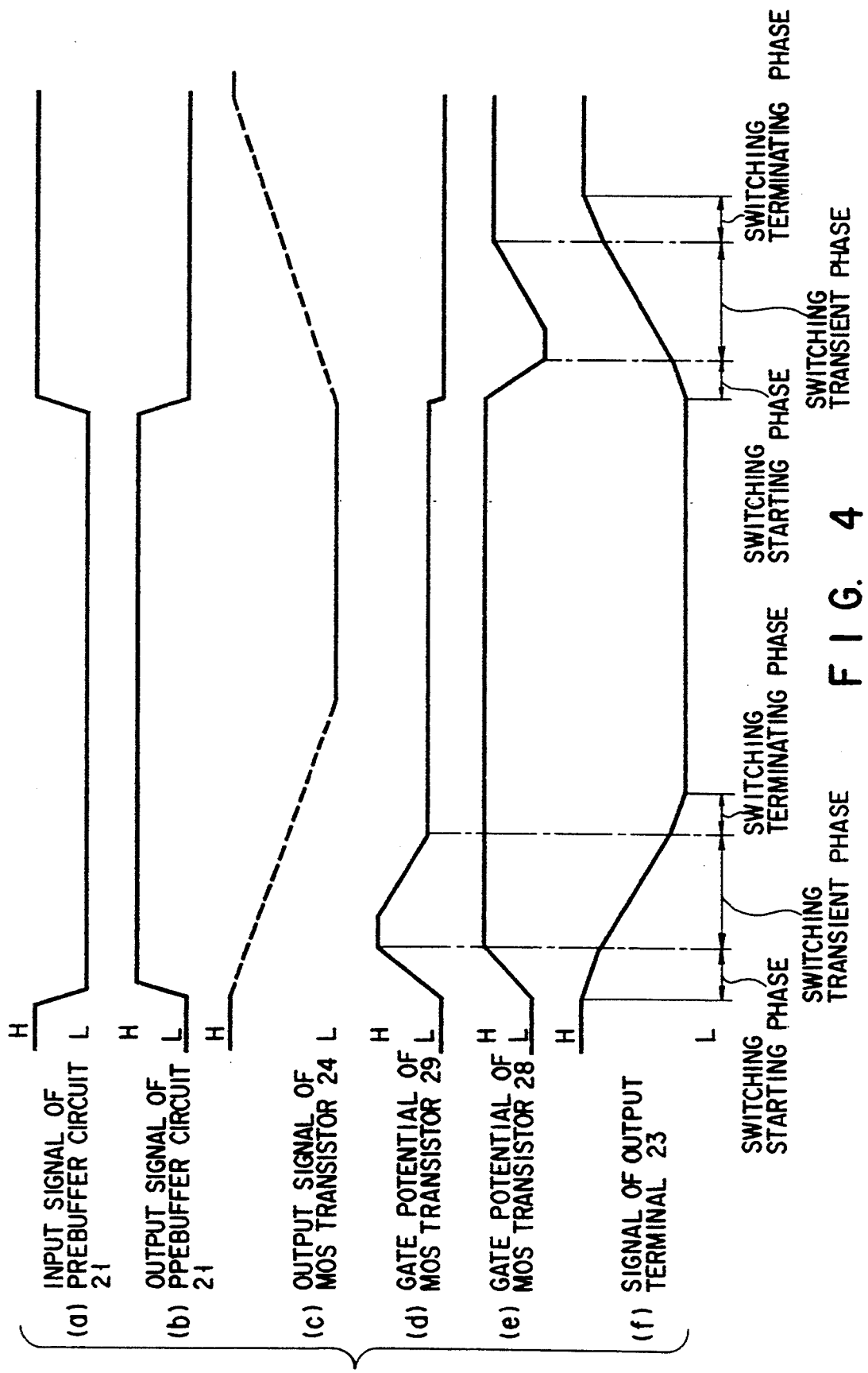
FIG. 4 is a diagram showing the waveforms of different signals of the first embodiment of FIG. 3.

FIG. 4 shows a schematic illustration of the waveforms of different signals of the circuit of FIG. 3 having a configuration as described above. Assume here that, when a signal in the integrated circuit, i.e., the signal currently being transmitted to the prebuffer circuit 21, is at level "H", the signal of the output terminal 23 is also at level "H". Under this condition, only the P-channel MOS transistor 24 in the first output buffer circuit 22A is active, whereas the N-channel MOS transistor 25 in the first output buffer circuit 22A and the P- and N-channel MOS transistors 28, 29 in the second output buffer circuit 22B are inactive.

Assume now that the level of the input signal of the prebuffer circuit 21 changes from "H" to "L" (FIG. 4(a)). Then, the level of the output signal of the prebuffer circuit 21 changes from "L" to "H" (FIG. 4(b)) to deactivate the P-channel MOS transistor 24 (FIG. 4(c)) and activate the N channel MOS transistor 25 (not shown) in the first output buffer circuit 22A. Note that the waveform of the output signal of the MOS transistor 24 indicated by a broken line in FIG. 4(c) is shown there to help with understanding the present invention. It is in fact the waveform of a signal obtained when only the first output buffer circuit 22A is connected to a prebuffer circuit 21 as in the case of a conventional output circuit. The electric potential of the output terminal 23 is discharged through a discharge route constituted by the MOS transistor 25 and the level of the signal of the output terminal 23 starts to go down from "H" to "L". On the other hand, the output signal of the prebuffer circuit 21 is transmitted to the gate of the P- and N-channel MOS transistors 28 and 29 in the second output buffer circuit 22B respectively through the first and second capacitance 26 and 27. As described earlier, the current driving capability of the prebuffer circuit 21 and the first and second capacitances 26, 27 are so selected that the variation per unit time in the potential of the gate of the MOS transistor 28 and that of the gate of the MOS transistor 29 of the second output buffer circuit 22B are smaller than that of any output signal of the prebuffer circuit 21. Therefore, while the P-channel MOS transistor 28 is deactivated and the N channel MOS transistor is activated in the second output buffer circuit 22B, the variation per unit time of the discharge current (di/dt) running from the output terminal 23 through the discharge route constituted by the N-channel MOS transistor 29 is relatively small. Consequently, the variation per unit time of the discharge current immediately after the start of discharging the load of the output terminal 23 will be substantially equal to that of the first output buffer circuit 22A or that of the entire output buffer circuit 22. In other words, the variation per unit time in the potential of the output terminal 23 is substantially equal to that of the MOS transistor 24. This corresponds to the condition where a switching operation is started as shown in FIG. 4(f).

When the level of the gate potential of the MOS transistor 29 rises to "H" (FIG. 4(d)), the MOS transistor 31 in the second output buffer circuit 22B becomes activated. Thereafter, therefore, the gate potential of the MOS transistor 29 changes, following the variation of the potential of the output terminal 23. This corresponds to the condition where a switching operation is in a transient phase as shown in FIG. 4(f). When the signal of the output terminal 23 finally comes close to level "L", the MOS transistors 31, 29 are both deactivated and, therefore, only the N-channel MOS transistor 25 is available as a discharge path for the output terminal 23 in the first output buffer circuit 22A (not shown). Consequently, the variation per unit time of the discharge current of the output terminal 23 will be substantially equal to that of the first output buffer circuit 22A or that of the entire output buffer circuit 22. This corresponds to the condition where a switching operation is terminated as shown in FIG. 4(f).

Thus, both the N-channel MOS transistor 25 in the first output buffer circuit 22A and the N-channel MOS transistor 29 in the second output buffer circuit 22B are activated to drive the load of the output circuit with a sufficiently large current driving capability in a transient phase where the signal of the output terminal 23 moves from level "H" to level "L" so that the switching speed may be increased for the output signal of the output circuit. Besides, since only the N-channel MOS transistor 25 in the first output buffer circuit 22A is activated in a terminating phase of switching operation, where the level of the output signal falls to level "L", the resistive component of the load existing between the output terminal 23 and the low potential power source GND becomes greater than that of a conventional output circuit. Thus, if simultaneous switching noises are generated in a plurality of output circuits (not shown) other than the one in question and eventually reaches it through the power source line for the low potential power source GND (FIG. 3), it may not get to the output terminal 23, passing through the output circuit. So, with an output circuit having a configuration as illustrated in FIG. 3, the level of noise generation in a semiconductor integrated circuit can be remarkably reduced while maintaining the advantage of high speed operation of the circuit.

Next, assume that the level of the input signal of the prebuffer circuit 21 rises from "L" to "H" (FIG. 4(a)). Since, in the above embodiment, the output signal of the prebuffer circuit 21 is fed by way of the first capacitance 26 to the gate of the P-channel MOS transistor 28 whose drain is connected to the output terminal 23. The current path between the source and the drain of the P-channel MOS transistor 30 is inserted between the gate of the MOS transistor 28 and the output terminal 23. Both the P-channel MOS transistor 24 in the first output buffer circuit 22A and the P-channel MOS transistor 28 in the second output buffer circuit 22B are activated to drive the load with a sufficiently large current driving capability in a transient phase of switching operation, where the signal of the output terminal 23 moves from level "L" to level "H", so that the switching speed may be increased for the output signal to quickly rise to level "H". Besides, since only the P-channel MOS transistor 24 in the first output buffer circuit 22A is activated in a terminating phase of switching operation, where the level of the output signal rises to level "H", the resistive component of the load existing between the output terminal 23 and the high power source Vcc becomes greater than that of a conventional output circuit. Thus, again, if simultaneous switching noise is generated and eventually reaches the output circuit it through the power source line for the high potential power source Vcc, it may not get to the output terminal 23, passing through the output circuit.

Figure 5:
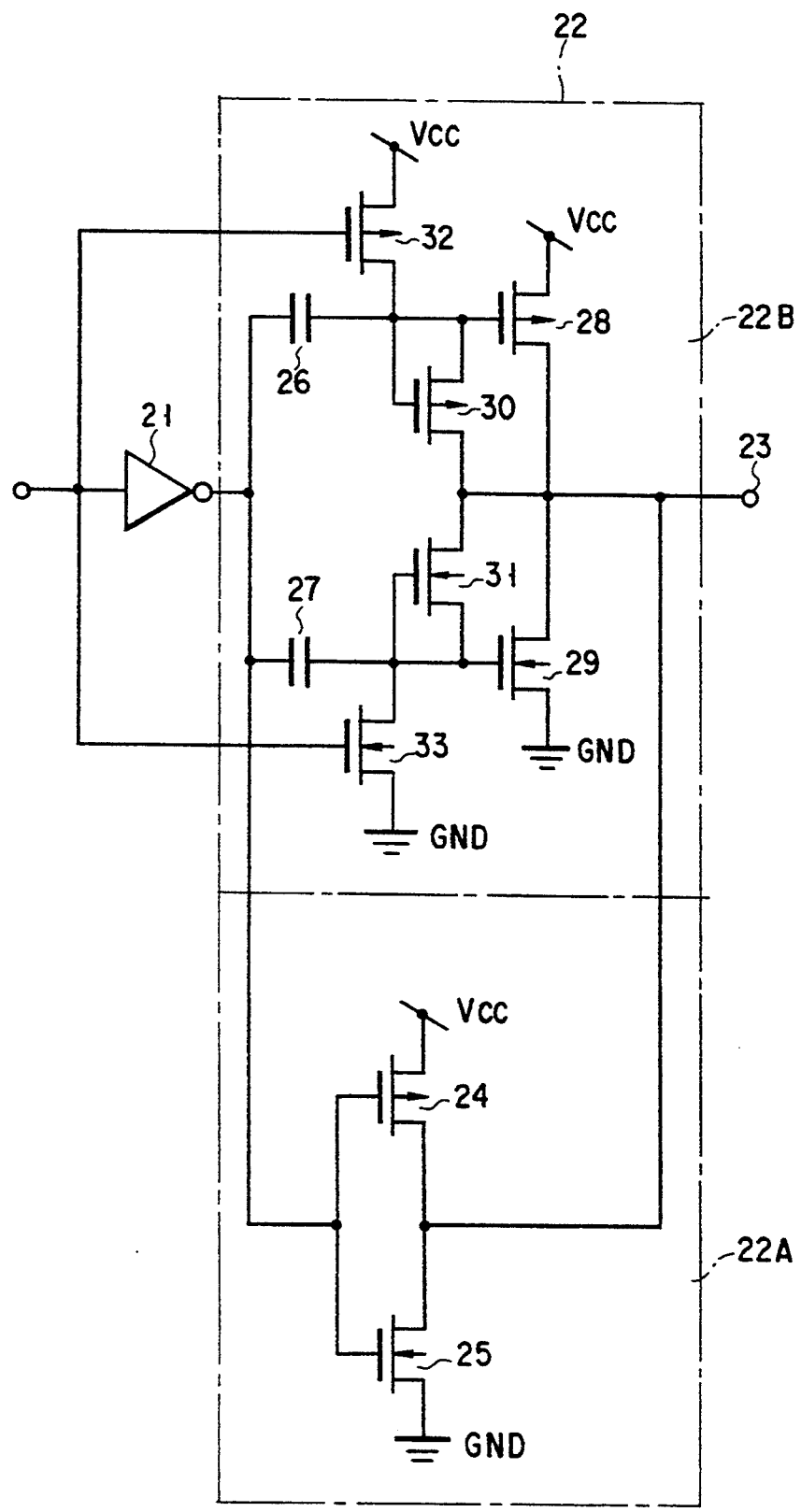
FIG. 5 is a circuit diagram of a second embodiment of the present invention.

FIG. 5 shows a circuit diagram of a second embodiment of the present invention. While this embodiment is similar to the first embodiment in general, it additionally comprises a P-channel MOS transistor 32 and an N-channel MOS transistor 33 in its second output buffer circuit 22B in order to make certain that a deactivated condition of its P-channel MOS transistor 28 and N-channel MOS transistor 29 can be securely established in the second output buffer circuit 22B. More specifically, the current path between the source and the drain of the P-channel MOS transistor 32 is inserted between the high potential power source Vcc and the gate of said P-channel MOS transistor 28, to which a signal having a phase identical with that of the input signal of the prebuffer circuit 21, i.e., the input signal itself as illustrated in FIG. 4(a) is fed. The MOS transistors 32, 33 have dimensions smaller than those of the MOS transistors 28, 29.

With such an arrangement, when the level of the signal of the output terminal 23 rises from "L" to "H", the level of the input signal of the prebuffer circuit 21 falls from "H" to "L". Under this condition, the MOS transistor 28 is securely deactivated because the gate potential of the MOS transistor 28 in the second output buffer circuit 22B is ultimately set to Vcc by means of the MOS transistor 32. Likewise, because of the provision of a N-channel MOS transistor 33, the N-channel MOS transistor 29 is securely deactivated in the second output buffer circuit 22B when the level of the signal of the output terminal 23 falls from "H" to "L".

FIG. 6 shows a circuit diagram of a third embodiment of the present invention. While this embodiment is similar to the first embodiment, it additionally comprises a pair of resistors 34, 35 for adjusting the response speed of the gate potential of the two MOS transistors 28, 29 in the second output buffer circuit 22B relative to the potential of the output signal of the prebuffer circuit 21 while the resistor 34 is inserted between the output terminal of the prebuffer circuit 21 and one of the terminals of the first capacitance 26, the other resistor 35 is inserted between the output terminal of the prebuffer circuit 21 and one of the terminals of second capacitance 27.

FIG. 7 shows a circuit diagram of a fourth embodiment of the present invention, while this embodiment is similar to the third embodiment, its circuit configuration is so modified that the resistor 34 for adjustment of the response speed is inserted between the other terminal of the first capacitance 26 and the gates of the MOS transistors 28, 39 and the resistor 35 is inserted between the other terminal of the second capacitance 27 and the gates of the MOS transistors 29, 31. Note that in either of the last two embodiments, the resistors 34, 35 are respectively connected in series with the first and second capacitances 26, 27.

Figure 8:
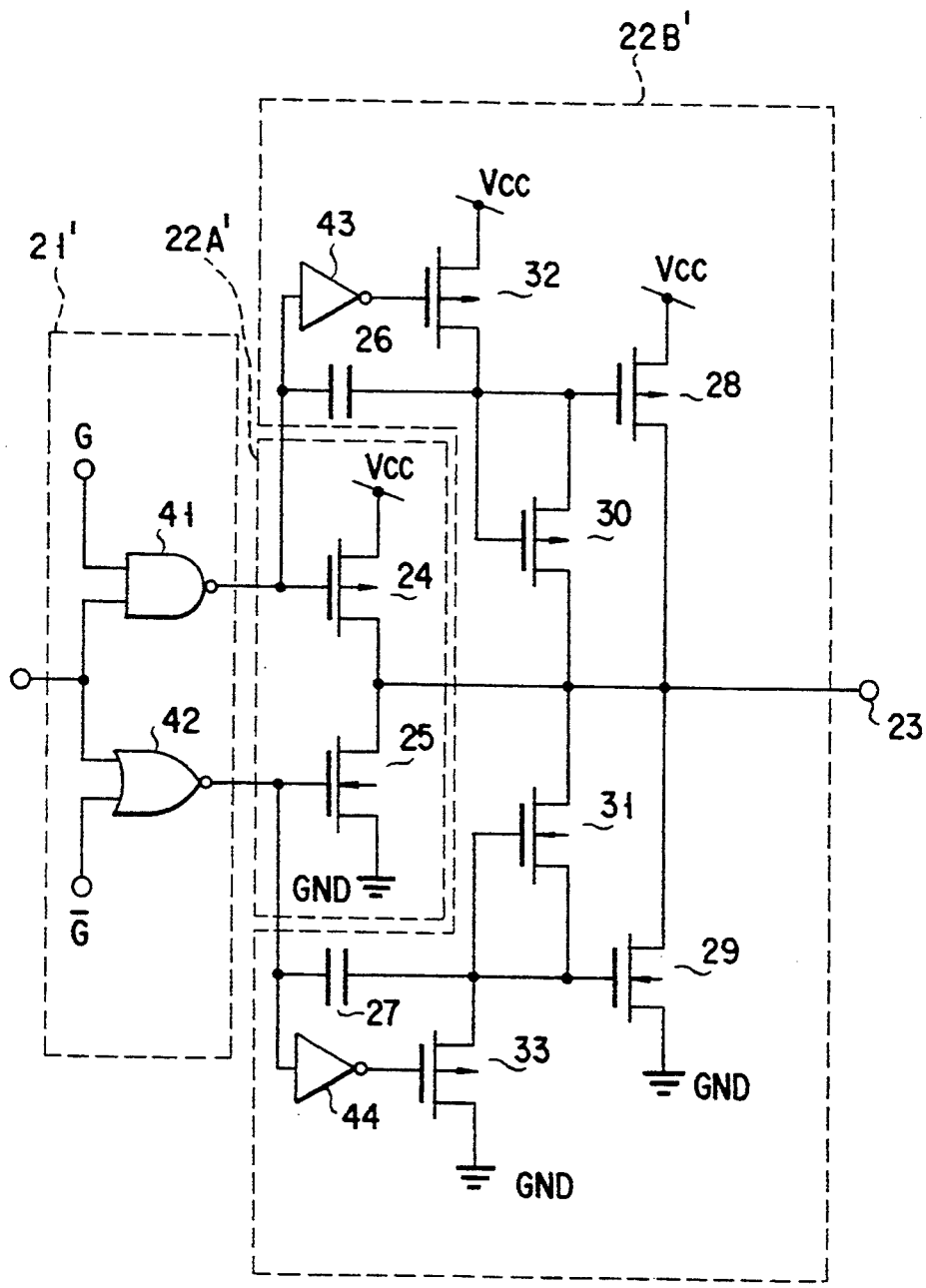
FIG. 8 is a circuit diagram of a fifth embodiment of the present invention.

FIG. 8 shows a circuit diagram of a fifth embodiment of the present invention. While this embodiment is similar to the first embodiment, it is additionally provided with a feature of holding the output terminal to a high impedance state. Referring to FIG. 8, the signal in the semiconductor integrated circuit is transmitted simultaneously to a pair of output buffer circuits 22A', 22B' as two identical signals that have been amplified and waveform-shaped by a prebuffer circuit 21' comprising a NAND gate 41 and a NOR gate 42. The output signals of said two output buffer circuits 21A', 21B' are sent out of the semiconductor integrated circuit through the output terminal 23. Note that, here again, the output circuit shown in FIG. 8 is simply one of a plurality of identical circuits disposed between a pair of power source lines as illustrated in FIG. 2. Control signals G, $\overline{G}$ for holding the output terminal 23 to a high impedance state are respectively fed to the NAND gate 41 and the NOR gate 42 that constitute the prebuffer circuit 21'.

The output buffer circuit 22A' comprises a P-channel MOS transistor 24 whose source, drain and gate are connected to the high potential power source Vcc, the output terminal 23 and the output terminal of the NAND gate 41, respectively, and a P-channel MOS transistor 25 whose source, drain and gate are connected to the low potential power source GND, the output terminal 23 and the output terminal of the NOR gate 42, respectively. On the other hand, the output buffer circuit 22B' comprises a first capacitance 26 having one of the two terminals connected to the output terminal of the NAND gate 41; a second capacitance 27 having one of the two terminals connected to the output terminal of the NOR gate 42; a P-channel MOS transistor 28 whose source, drain and gate are respectively connected to the high potential power source Vcc, the output terminal 23 and the other terminal of the first capacitance 26; a P-channel MOS transistor 29 whose source, drain and gate are respectively connected to the low potential power source GND, the other terminal of the second capacitance 27; a P-channel MOS transistor 30 whose current path between the source and the drain is inserted between the gate of the MOS transistor 28 and the output terminal 23 and whose gate is connected to the gate of the MOS transistor 28; a P-channel MOS transistor 31 whose current path between the source and the drain is inserted between the gate of the MOS transistor 29 and the output terminal 23 and whose gate is connected to the gate of the MOS transistor 29; a first inverter 43 for inverting the output signal of said NAND gate 41; a second inverter 44 for inverting the output signal of said NOR gate 42; a P-channel MOS transistor 32 whose current path between the source and the drain is inserted between the gate of the MOS transistor 28 and the high potential power source Vcc and whose gate is supplied with the output signal of said first inverter 43; and a P-channel MOS transistor 33 whose current path between the source and the drain is inserted between the gate of the MOS transistor 29 and the low potential power source GND and whose gate is supplied with the output signal of said second inverter 44. Note that the P- and N-channel MOS transistors 24 and 25 have dimensions including the channel width that are smaller than the corresponding ones of the P- and N-channel MOS transistors 28 and 29 which are used to directly drive the output terminal 23. The current driving capability of the NAND gate 41 and that of the NOR gate 42 as well as the values of the first and second capacitances 26, 27 are so selected that variation per unit time in the potential of the gates of the MOS transistors 28, 29 is smaller than the variation per unit time in the potential of the output signal of the NAND gate 41 and that of the output signal of the NOR gate 42.

With a circuit of FIG. 8 having an arrangement as described above, when control signals G, $\overline{G}$ are respectively set to levels "L" and "H", the level of the output signal of the NAND gate 41 and that of the output signal of the NOR gate 42 respectively get to "H" and "L" in the prebuffer circuit to deactivate all the P-channel MOS transistors 24, 28 and the N-channel MOS transistors 25, 29 so that the output terminal 23 may be held to a high impedance state. On the other hand, when the control signals G, $\overline{G}$ are respectively set to levels "H" and "L", the NAND gate 41 and the NOR gate 42 operate as inverters that invert input signals. Thus, the embodiment of FIG. 8 operates as an output circuit similar to that of FIG. 5. In this embodiment, however, the P-channel MOS transistor 32 and the N-channel MOS transistor 33 for securely deactivate the P-channel MOS transistor 28 and the N-channel MOS transistor 29 need to be controlled by control signals G, $\overline{G}$ for activation and deactivation. Therefore, the output of the NAND gate 41 and that of the NOR gate 42 are respectively inverted by the first and second inverters 43, 44 before they are fed to the respective gates of the transistors 32, 33.

FIG. 9 shows a circuit diagram of a sixth embodiment of the present invention. This embodiment is similar to the first embodiment but, while the gates of the P- and N-channel MOS transistors 30, 31 are respectively connected to the other terminals of the first and second capacitances 26, 27, the gates of the two MOS transistors 30, 31 are connected to the output terminal of the prebuffer circuit 21 so that the MOS transistors 30, 31 may be controlled by the output signal of the prebuffer circuit 21.

FIG. 10 shows a circuit diagram of a seventh embodiment of the present invention. This embodiment is similar to the embodiment of FIG. 9 in that it is obtained by modifying the embodiment of FIG. 5 such that the MOS transistors 30, 31 are controlled by the output signal of the prebuffer circuit 21.

Figure 11:
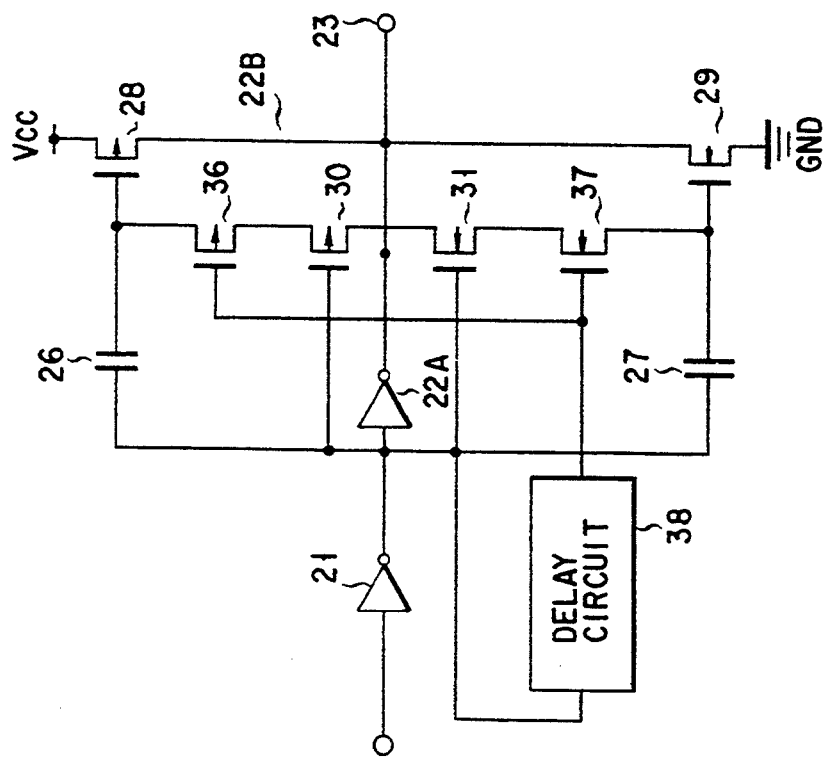
FIG. 11 is a circuit diagram of an eighth embodiment of the present invention.

FIG. 11 shows a circuit diagram of an eighth embodiment of the present invention. This embodiment is obtained by modifying the embodiment of FIG. 3 such that the current between the source and the drain of the P-channel MOS transistor 36 is inserted in parallel with the current path between the source and the drain of the P-channel MOS transistor 30 and the current path between the source and the drain of the N-channel MOS transistor 36 is inserted in parallel with the current path between the source and the drain of the N-channel MOS transistor 31, while a delay circuit 38 is additionally arranged for delaying the output signal of the prebuffer circuit 21 by a given period of time so that the follow-up characteristics of the output of the second output buffer circuit 22B relative to the input of the circuit 22B may be controlled by supplying the output of said delay circuit 38 to the gates of the two MOS transistors 36, 37.

Figure 12:
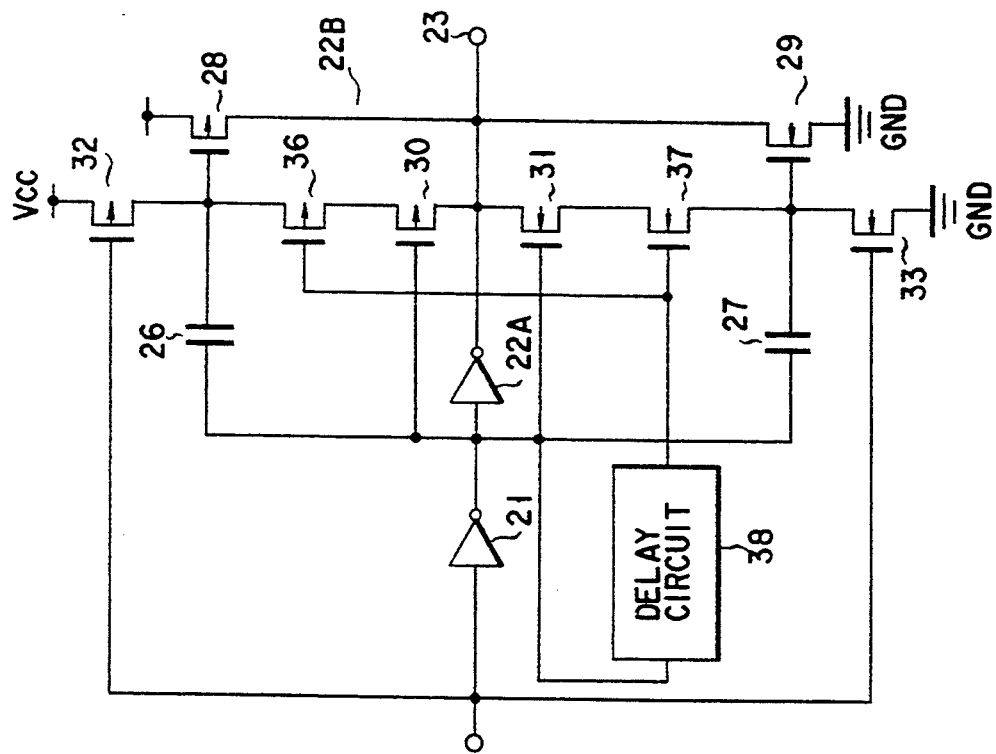
FIG. 12 is a circuit diagram of a ninth embodiment of the present invention.

FIG. 12 shows a circuit diagram of a ninth embodiment of the present invention. This embodiment is obtained by modifying the embodiment of FIG. 5 in a manner similar to that of FIG. 11 so that the follow-up characteristics of the output of the second output buffer circuit 22B relative to the input of the circuit 22B may also be controlled.

Figure 1:
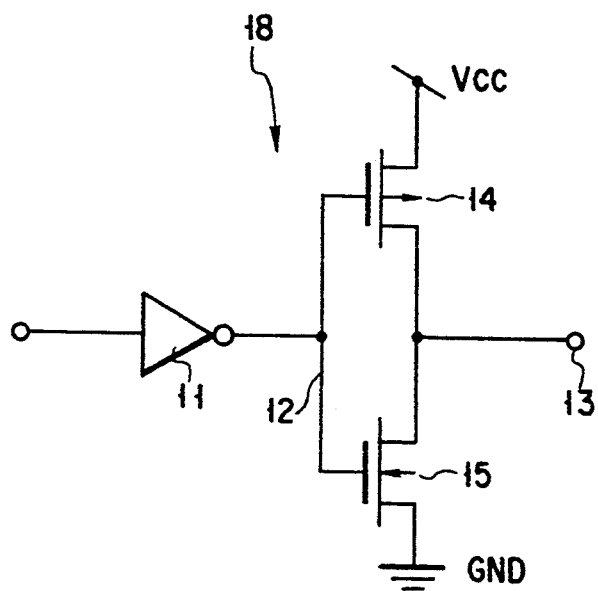
FIG. 1 is a circuit diagram of a conventional output circuit of a semiconductor integrated circuit.
Figure 13:
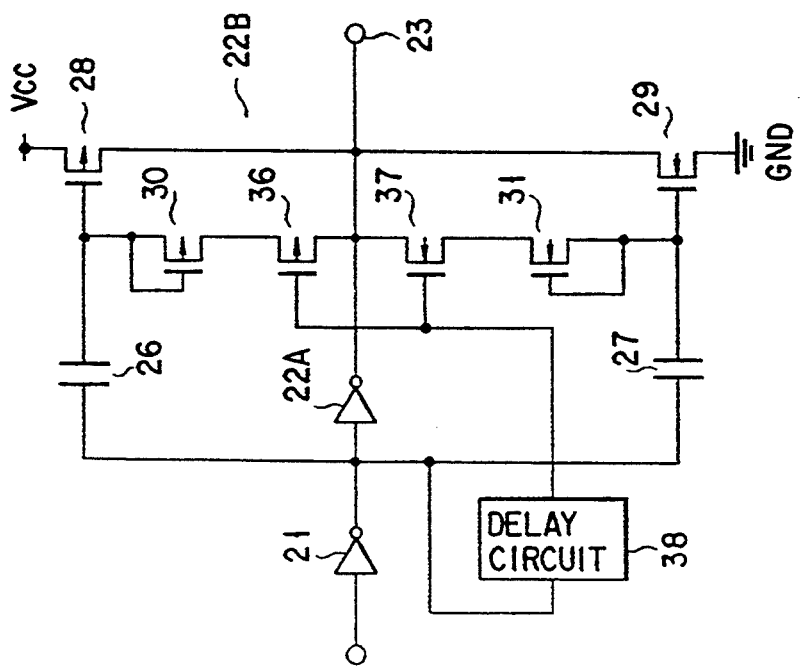
FIG. 13 is a circuit diagram of a tenth embodiment of the present invention.

FIG. 13 shows a circuit diagram of a tenth embodiment of the present invention. This embodiment is obtained by modifying the embodiment of FIG. 1 such that the current path between source and the drain of the P-channel MOS transistor 36 is inserted in series with the current path between the source and the drain of the P-channel MOS transistor 30 and the current path between the source and the drain of the N-channel MOS transistor 37 is inserted with cur rent path between the source and the drain of the N-channel MOS transistor 31, while a delay circuit 38 is additionally arranged for delaying the output signal of the prebuffer circuit 21 by a given period of time so that the follow-up characteristics of the output of the second output buffer circuit 22B relative to the input of the circuit 22B may be controlled by supplying the output of said delay circuit 38 to the gates of the two MOS transistors 36, 37.

Figure 14:
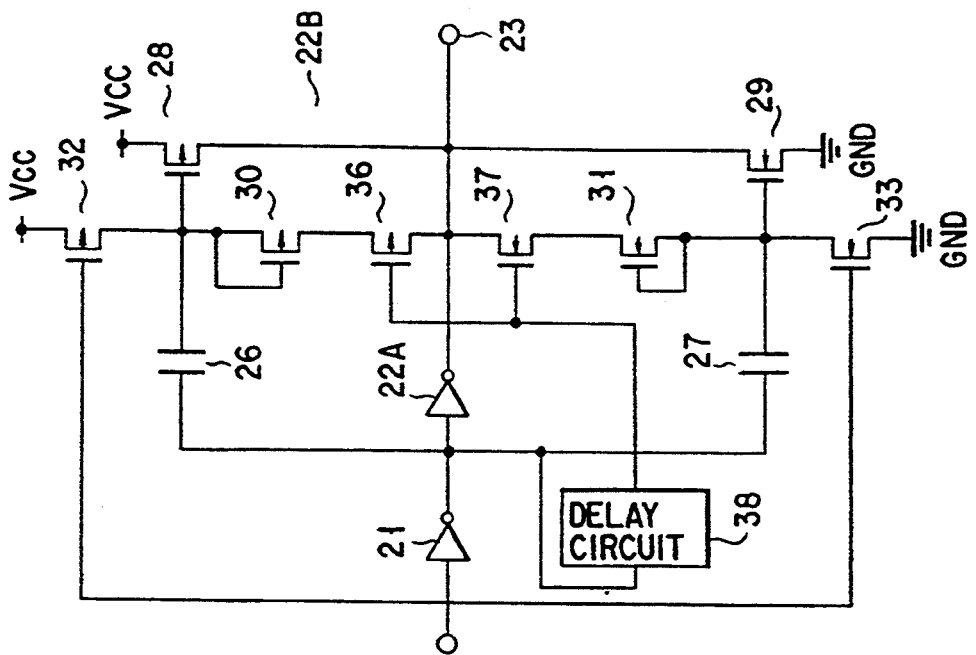
FIG. 14 is a circuit diagram of an eleventh embodiment of the present invention.

FIG. 14 shows a circuit diagram of an eleventh embodiment of the present invention. This embodiment is obtained by modifying the embodiment of FIG. 3 such that the current path between source and the drain of the P-channel MOS transistor 36 is inserted in series with the current path between the source and the drain of the P-channel MOS transistor 30 and the current path between the source and the drain of the N-channel MOS transistor 37 is inserted with current path between the source and the drain of the N-channel MOS transistor 31, while a delay circuit 38 is additionally arranged for delaying the output signal of the prebuffer circuit 21 by a given period of time so that the follow-up characteristics of the output of the second output buffer circuit 22B relative to the input of the circuit 22B may be controlled by supplying the output of said delay circuit 38 to the gates of the two MOS transistors 36, 37.

FIG. 15 shows a circuit diagram of a twelfth embodiment of the present invention. This embodiment is obtained by arranging an inverter 39 for inverting the signal of the output terminal 23 in place of the signal delay circuit 38 of the embodiment of FIG. 11 so that the follow-up characteristics of the output of the second output buffer circuit 22B relative to the input of the circuit 22B may be controlled by supplying the output of said inverter 39 to the gates of the P-channel MOS transistor 36 and the N-channel MOS transistor 37.

FIG. 16 shows a circuit diagram of a thirteenth embodiment of the present invention. This embodiment is obtained by modifying the embodiment of FIG. 12 in a manner similar to that of FIG. 15 so that the follow-up characteristics of the output of the second output buffer circuit 22B relative to the input of the circuit 22B may also be controlled.

Figure 17:
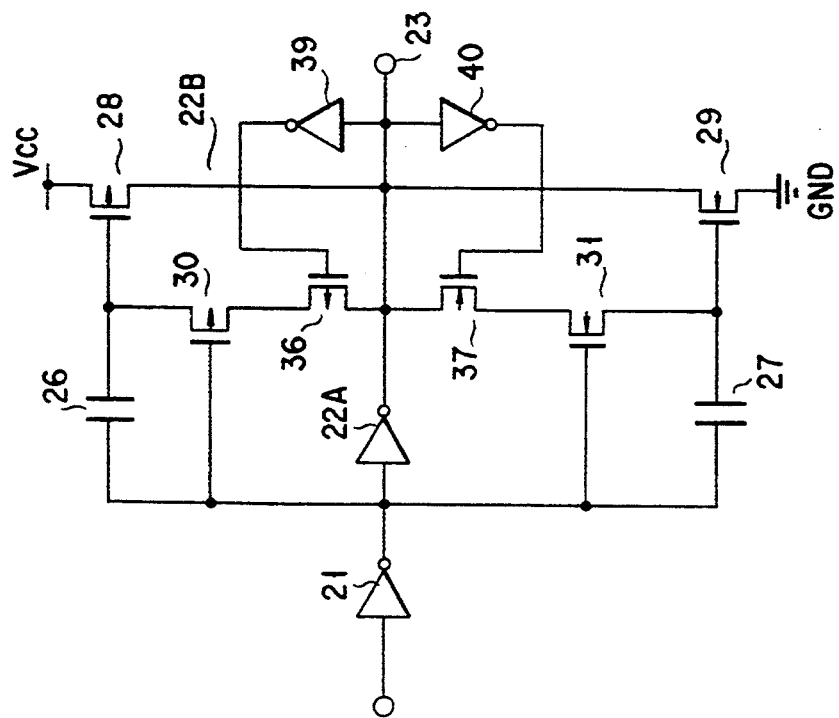
FIG. 17 is a circuit diagram of a fourteenth embodiment of the present invention.

FIG. 17 shows a circuit diagram of a fourteenth embodiment of the present invention, while this embodiment is similar to that of FIG. 15, it is obtained by additionally arranging an inverter 40 for inverting the signal of the output terminal 23 so that the output of the inverter 40 is supplied to the gate of the N-channel MOS transistor 37 instead of the output of the inverter 39 to the gate of said MOS transistor 37.

Figure 18:
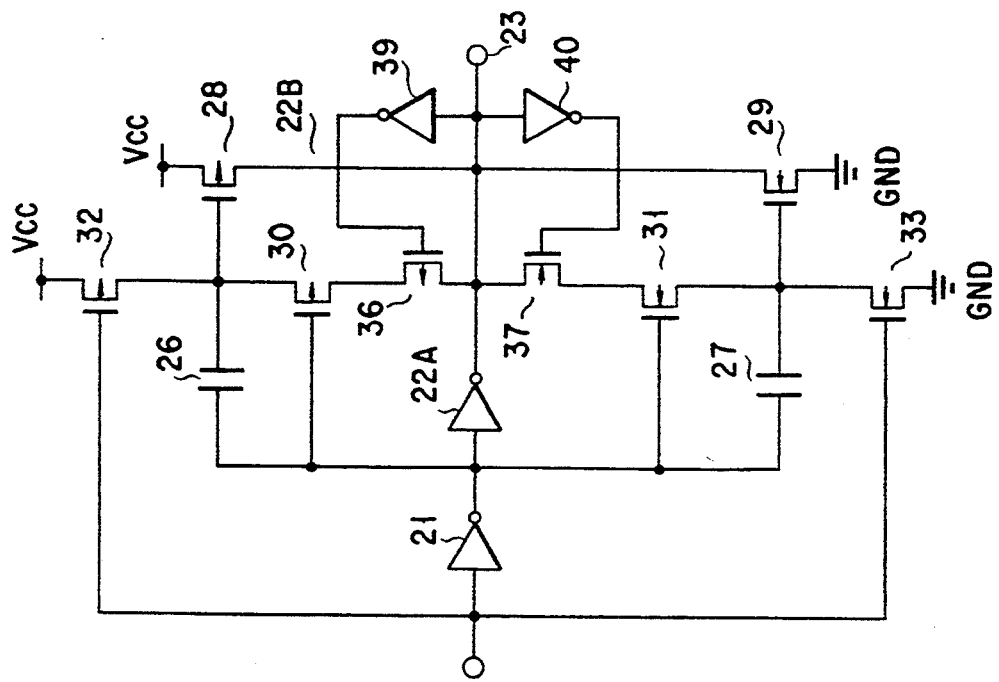
FIG. 18 is a circuit diagram of a fifteenth embodiment of the present invention.

FIG. 18 shows a circuit diagram of a fifteenth embodiment of the present invention, while this embodiment is similar to that of FIG. 16, it is obtained by additionally arranging an inverter 40 for inverting the signal of the output terminal 23 so that the output of the inverter 40 is supplied to the gate of the N-channel MOS transistor 37 instead of the output of the inverter 39 to the gate of the MOS transistor 37.

FIG. 19 shows a circuit diagram of a sixteenth embodiment of the invention. As in the case of the modification of FIG. 8, while this embodiment is similar to the embodiment of FIG. 10, it is additionally provided with a feature of holding the output terminal to a high impedance state. The components of this embodiment which are identical with those of the embodiments of FIGS. 8 and 10 are indicated by the same reference symbols and will not be described here any further.

Figure 20:
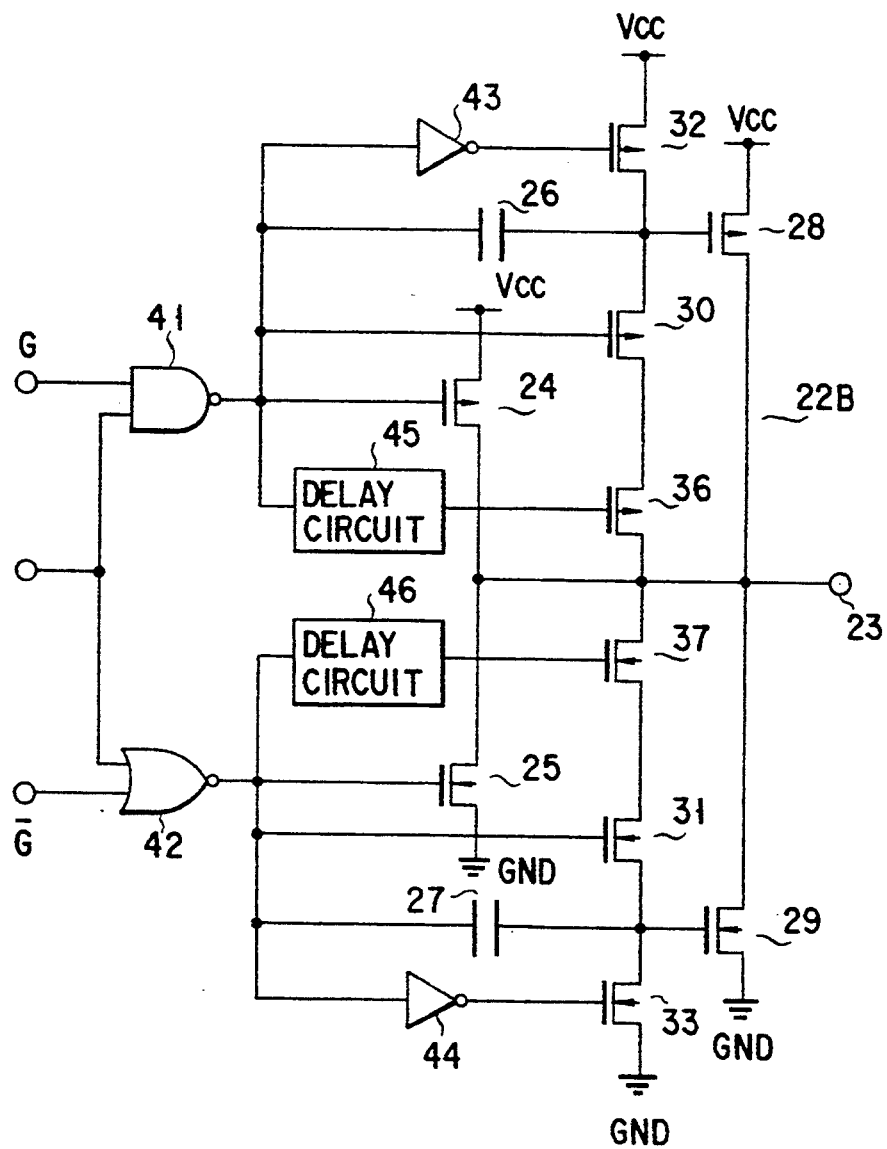
FIG. 20 is a circuit diagram of a seventeenth embodiment of the present invention.

FIG. 20 shows a circuit diagram of a seventeenth embodiment of the present invention. As in the case of the modification of FIG. 8, while this embodiment is similar to the embodiment of FIG. 12, it is additionally provided with a feature of holding the output terminal to a high impedance state. A pair of signal delay circuit 45, 46 are provided in this embodiment in place of the single delay embodiment 38 of the embodiment of FIG. 12 and the output of the signal delay circuit 45 is supplied to the gate of the P-channel MOS transistor 36, while the output of the signal delay circuit 46 is supplied to the gate of the N channel MOS transistor 37.

Figure 21:
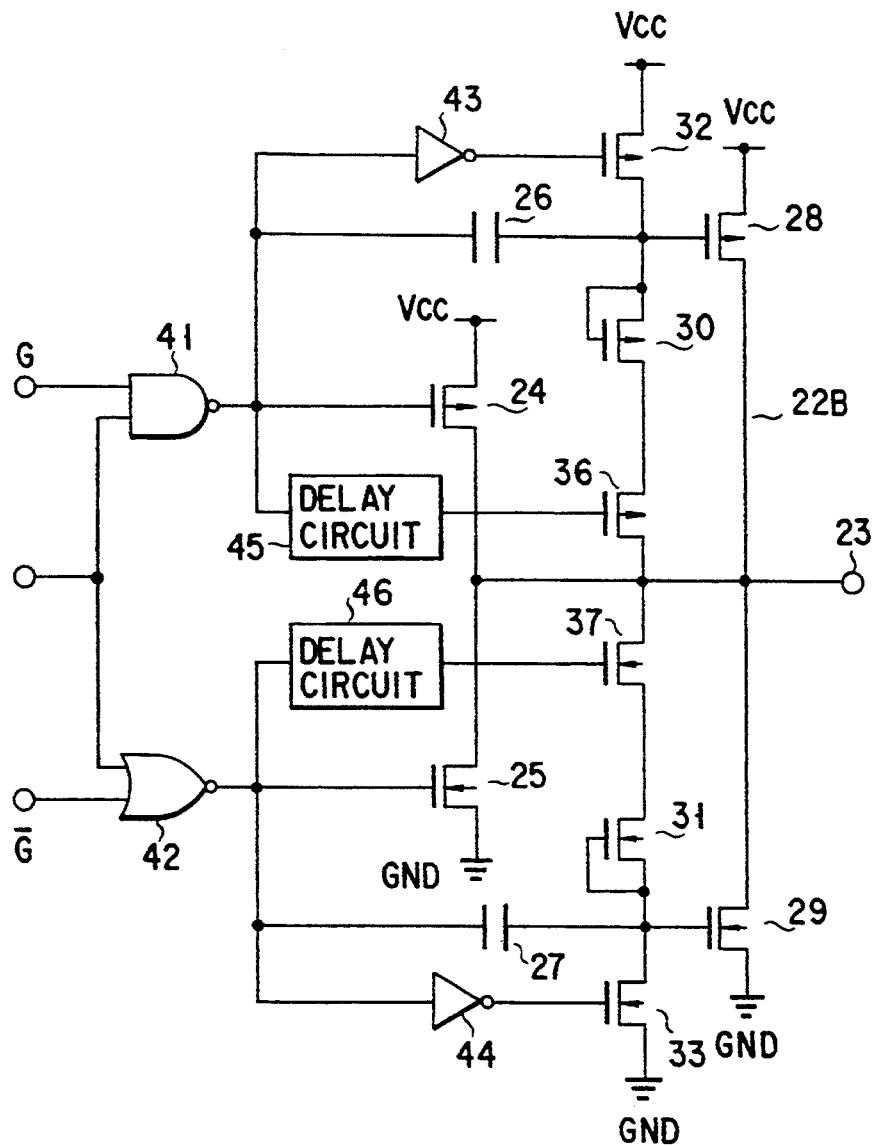
FIG. 21 is a circuit diagram of an eighteenth embodiment of the present invention.

FIG. 21 shows a circuit diagram of an eighteenth embodiment of the present invention. As in the case of the modification of FIG. 8, while this embodiment is similar to the embodiment of FIG. 14, it is additionally provided with a feature of holding the output terminal to a high impedance state. Here again, a pair of signal delay circuit 45, 46 are provided in this embodiment in place of the single delay embodiment 38 of the embodiment of FIG. 14.

Figure 22:
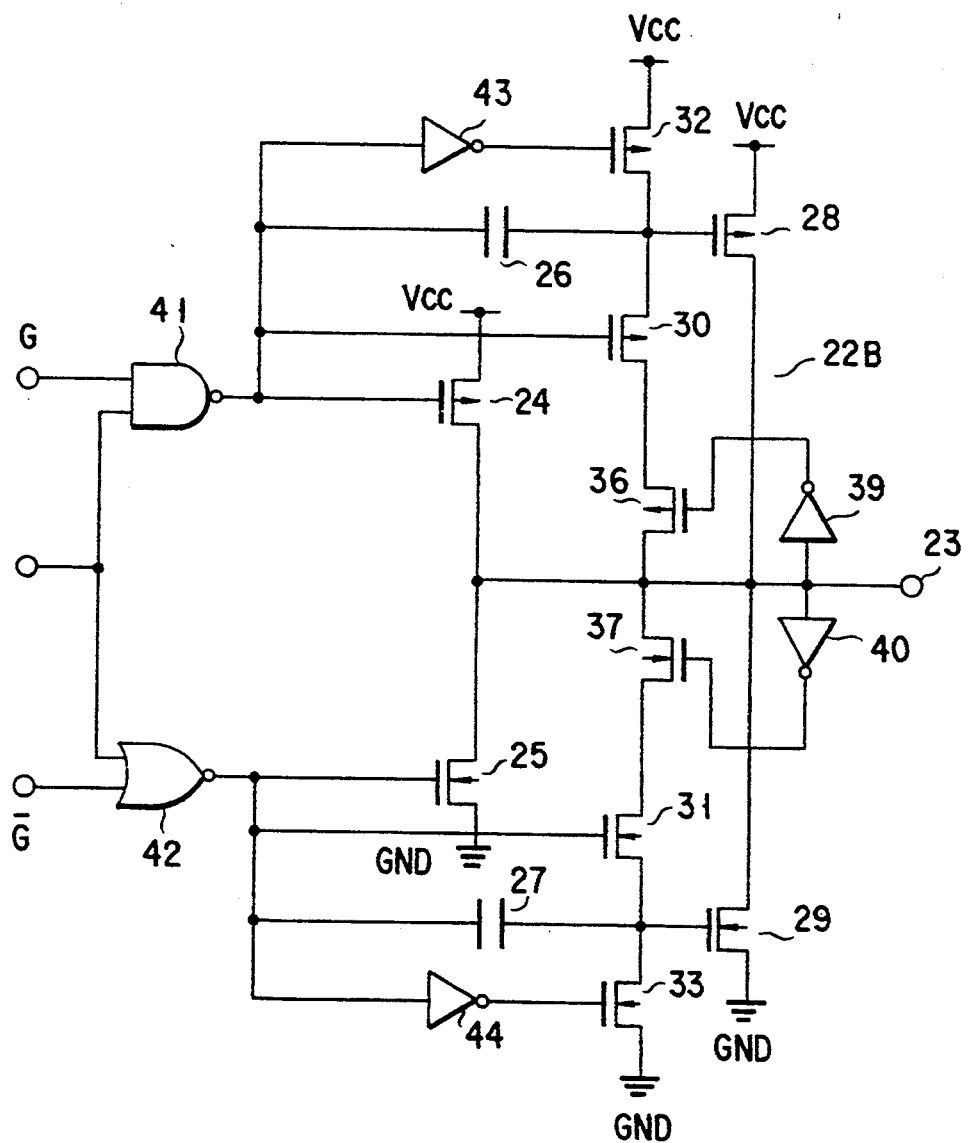
FIG. 22 is a circuit diagram of a nineteenth embodiment of the present invention.

FIG. 22 shows a circuit diagram of a nineteenth embodiment of the present invention. As in the case of the modification of FIG. 8, while this embodiment is similar to the embodiment of FIG. 18, it is additionally provided with a feature of holding the output terminal to a high impedance state.

Figure 23:
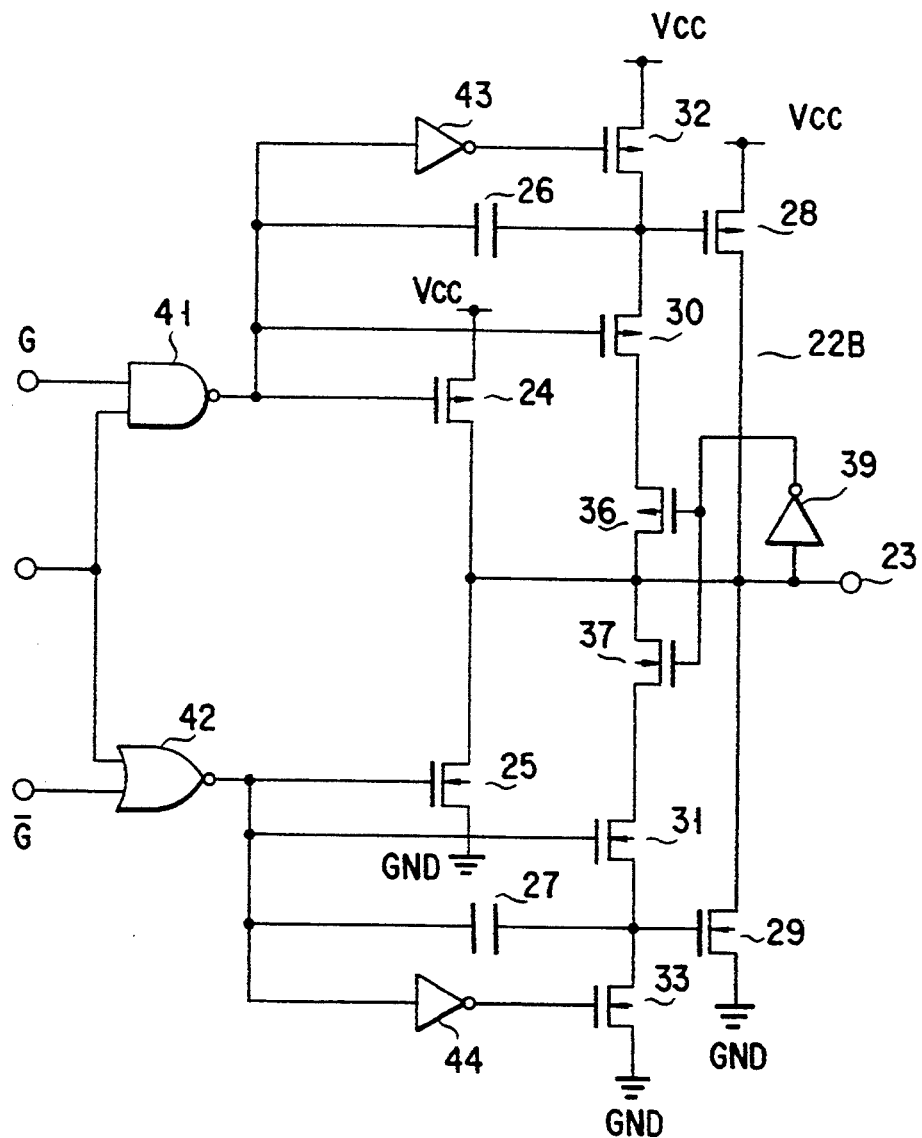
FIG. 23 is a circuit diagram of a twentieth embodiment of the present invention.

FIG. 23 shows a circuit diagram of a twentieth embodiment of the present invention. As in the case of the modification of FIG. 8, while this embodiment is similar to the embodiment of FIG. 16, it is additionally provided with a feature of holding the output terminal to a high impedance state.

As is apparent from the above description, an output circuit to be used for a semiconductor integrated circuit according to the present invention can effectively reduce the in influence of simultaneous switching noise without deteriorating the load driving capability of the output circuit.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An output circuit of a semiconductor integrated circuit, comprising: a signal output terminal;
    a prebuffer circuit for receiving an internal signal of said semiconductor integrated circuit;
    a first output buffer circuit connected between said prebuffer circuit and said signal output terminal, and controlled by the output signal of said prebuffer circuit for activation/deactivation; and
    a second output buffer circuit connected in parallel with said first output buffer circuit and between said prebuffer circuit and said signal output terminal, and controlled for activation by the output signal of said prebuffer circuit through a capacitance and for deactivation by a transistor circuit which is connected to said signal output terminal and is made active when a potential of said signal output terminal is within a preset range between high and low signal levels.

2. An output circuit of a semiconductor integrated circuit according to claim 1, wherein said second output buffer circuit comprises:
    a pair of capacitances, each having one of its terminals connected to the output terminal of said prebuffer circuit;
    a first pair of MOS transistors, each having one of the terminals of its current path between its source and drain connected to a power source, the other terminal of the current path connected to said signal output terminal and its gate connected to the other terminal of the corresponding one of said capacitances; and
    a second pair of MOS transistors, each having one of the terminals of its current path between its source and drain as well as its gate connected to the gate of the corresponding one of said first MOS transistors and the other terminal of the current path connected to said signal output terminal.

3. An output circuit of a semiconductor integrated circuit according to claim 1, wherein said second output buffer circuit comprises:
    a pair of capacitances, each having one of its terminals connected to the output terminal of said prebuffer circuit;
    a first pair of MOS transistors, each having one of the terminals of its current path between its source and drain connected to a power source, the other terminal of the current path connected to said signal output terminal and its gate connected to the other terminal of the corresponding one of said capacitances; and
    a second pair of MOS transistors, each having one of the terminals of its current path between its source and drain connected to the gate of the corresponding one of said first MOS transistors, the other terminal of the current path connected to said signal output terminal and its gate connected to the output terminal of said prebuffer circuit.

4. An output circuit of a semiconductor integrated circuit according to claim 1, wherein said second output buffer circuit comprises:
    a pair of capacitances, each having one of its terminals connected to the output terminal of said prebuffer circuit;
    a first pair of MOS transistors, each having one of the terminals of its current path between its source and drain connected to a power source, the other terminal of the current path connected to said signal output terminal and its gate connected to the other terminal of the corresponding one of said capacitances;
    a second pair of MOS transistors, each having one of the terminals of its current path between its source and drain connected to the gate of the corresponding one of said first MOS transistors, the other terminal of the current path connected to said signal output terminal and its gate connected to the output terminal of said prebuffer circuit;

a signal delay circuit for receiving the output of said prebuffer circuit; and a third pair of MOS transistors, each having its current path inserted in parallel with the current path between the source and the drain of the corresponding one of said second MOS transistors, the output of said signal delay circuit being supplied to its gate.

5. An output circuit of a semiconductor integrated circuit according to claim 1, wherein said second output buffer circuit comprises:

a pair of capacitances, each having one of its terminals connected to the output terminal of said prebuffer circuit;

a first pair of MOS transistors, each having one of the terminals of its current path between its source and drain connected to a power source, the other terminal of the current path connected to said signal output terminal and its gate connected to the other terminal of the corresponding one of said capacitances;

a second pair of MOS transistors, each having one of the terminals of its current path between its source and drain connected to the gate of the corresponding one of said first MOS transistors, the other terminal of the current path connected to said signal output terminal and its gate connected to the other terminal of the corresponding one of said capacitances;

a signal delay circuit for receiving the output of said prebuffer circuit; and a third pair of MOS transistors, each having its current path inserted in parallel with the current path between the source and the drain of the corresponding one of said second MOS transistors, the output of said signal delay circuit being supplied to its gate.

6. An output circuit of a semiconductor integrated circuit according to claim 1, wherein said second output buffer circuit comprises:

a pair of capacitances, each having one of its terminals connected to the output terminal of said prebuffer circuit;

a first pair of MOS transistors, each having one of the terminals of its current path between its source and drain connected to a power source, the other terminal of the current path connected to said signal output terminal and its gate connected to the other terminal of the corresponding one of said capacitances;

a second pair of MOS transistors, each having one of the terminals of its current path between its source and drain connected to the gate of the corresponding one of said first MOS transistors, the other terminal of the current path connected to said signal output terminal and its gate connected to the output terminal of said prebuffer circuit;

an inverting circuit having its input terminal connected to said signal output terminal; and a third pair of MOS transistors, each having its current path inserted in series with the current path between the source and the drain of the corresponding one of said second MOS transistors, an output of said inverting circuit being supplied to its gate.

7. An output circuit of a semiconductor integrated circuit according to claim 2, wherein said second output buffer circuit further comprises a pair of resistors connected in series with the respective capacitances.

8. An output circuit of a semiconductor integrated circuit according to claim 1, wherein said prebuffer circuit is provided with a tri-state feature of holding its output to a high impedance state in accordance with a control signal supplied to it.

9. An output circuit of a semiconductor integrated circuit, comprising:

a signal output terminal;

a prebuffer circuit for receiving an internal signal of said semiconductor integrated circuit;

a first output buffer circuit having its input terminal connected to the output terminal of said prebuffer circuit and its output terminal connected to said signal output terminal; and a second output buffer circuit comprising at least a pair of capacitances, each having one of its terminals connected to the output terminal of said prebuffer circuit, a first pair of transistors, each having one of the terminals of its current path connected to said signal output terminal and its control electrode connected to the other terminal of said capacitance and a second pair of transistors of a conductive type same as that of the first pair of transistors, each having its current path inserted between the control electrode of the corresponding first transistor and said signal output terminal and its control electrode connected to the other terminal of the corresponding capacitance.

10. An output circuit of a semiconductor integrated circuit according to claim 9, wherein said capacitances are constituted by a parasitic capacitance including the capacitances existing on the control electrodes of the first and second transistors.

11. An output circuit of a semiconductor integrated circuit according to claim 1, wherein said second output buffer circuit comprises:

first and second capacitances each having one of its terminals connected to the output terminal of said prebuffer circuit;

a P-channel first MOS transistor having one of the terminals of its current path between its source and drain connected to a first power source and its gate connected to the other terminal of said first capacitance;

an N-channel second MOS transistor having one of the terminals of its current path between its source and drain connected to a second power source and its gate connected to the other terminal of said second capacitance;

a P-channel third MOS transistor having its current path between its source and drain inserted between the gate of said first MOS transistor and said output terminal and its gate connected to the other terminal of said first capacitance; and an N-channel fourth MOS transistor having its current path between its source and drain inserted between the gate of said second MOS transistor and said output terminal and its gate connected to the other terminal of said second capacitance.

12. An output circuit of a semiconductor integrated circuit according to claim 11, wherein aid output buffer circuit further comprises:

a P-channel fifth MOS transistor having one of the terminals of its current path between its source and drain connected to said first power source and the other terminal of the current path connected to the gate of said first MOS transistor, the internal signal supplied to said output buffer circuit being further supplied to its gate; and an N-channel sixth MOS transistor having one of the terminals of its current path between its source and drain connected to said second power source and the other terminal of the current path connected to the gate of said second MOS transistor, the internal signal supplied to said output buffer circuit being further supplied to its gate.

13. An output circuit of a semiconductor integrated circuit according to claim 11, wherein said second output buffer circuit further comprises first and second resistors respectively connected in series with said first and second capacitances.

14. An output circuit of a semiconductor integrated circuit according to claim 11, wherein said first output buffer circuit comprises:

a P-channel fifth MOS transistor having its gate connected to the output terminal of said prebuffer circuit; and an N-channel sixth MOS transistor having its gate connected to the output terminal of said prebuffer circuit and its drain connected to the drain of said fifth MOS transistor; and said fifth and sixth MOS transistors of said first output buffer circuit having a current driving capability smaller than that of said first and second MOS transistors of said second output buffer circuit.

15. An output circuit of a semiconductor integrated circuit, comprising:

a signal output terminal;

a prebuffer circuit for receiving an internal signal of said semiconductor integrated circuit and a control signal for controlling said signal output terminal in a high impedance state and transmitting first and second signals in accordance with the received two signals;

a first output buffer circuit comprising a P-channel MOS transistor and an N-channel MOS transistor for respectively receiving said first and second signals through their respective gates and having its output terminal connected to said signal output terminal; and a second output buffer circuit comprising first and second capacitances each having one of its terminals connected to the output terminal of said prebuffer circuit, a P-channel first MOS transistor having one of the terminals of its current path between its source and drain connected to a first power source and its gate connected to the other terminal of said first capacitance, an N-channel second MOS transistor having one of the terminals of its current path between its source and drain connected to a second power source and its gate connected to the other terminal of said second capacitance, a P-channel third MOS transistor having its current path between its source and drain inserted between the gate of said first MOS transistor and said output terminal and its gate connected to the other terminal of said first capacitance and an N-channel fourth MOS transistor having its current path between its source and drain inserted between the gate of said second MOS transistor and said output terminal and its gate connected to the other terminal of said second capacitance.

16. An output circuit of a semiconductor integrated circuit according to claim 15, wherein said first capacitance is constituted by a parasitic capacitance including the capacitances existing on the control electrodes of said first and third transistors and said second capacitance is constituted by a parasitic capacitance including the capacitances existing on the control electrodes of said second and fourth transistors.

17. An output circuit of a semiconductor integrated circuit according to claim 15, wherein said prebuffer circuit comprises:

a NAND gate circuit for receiving said internal signal and said control signal and transmitting said first signal; and a NOR gate circuit for receiving said internal signal and said control signal and transmitting said second signal.

18. An output circuit of a semiconductor integrated circuit according to claim 15, wherein said second output buffer circuit further comprises:

a P-channel with MOS transistor having one of the terminals of its current path between its source and drain connected to said first power source and the other terminal of the current path connected to the gate of said third MOS transistor, a third signal complementary to said first signal transmitted from said prebuffer circuit being supplied to its gate; and an N-channel sixth MOS transistor having one of the terminals of its current path between its source and drain connected to a second power source and the other terminal of the current path connected to the gate of said fourth MOS transistor, a fourth signal complementary to said second signal transmitted from said prebuffer circuit being supplied to its gate.

19. An output circuit of a semiconductor integrated circuit according to claim 15, wherein said first output buffer circuit comprises:

a P-channel fifth MOS transistor having its gate connected to the output terminal of said prebuffer circuit; and an N-channel sixth MOS transistor having its drain connected to the drain of said fifth MOS transistor, the second signal of said prebuffer circuit being supplied to its gate; and said fifth and sixth MOS transistors of said first output buffer circuit having a current driving capability smaller than that of said first and second MOS transistors of said second output buffer circuit.

* * * * *